(12) United States Patent
Srinivasan et al.

(10) Patent No.: US 6,549,457 B1
(45) Date of Patent: Apr. 15, 2003

(54) USING MULTIPLE STATUS BITS PER CELL FOR HANDLING POWER FAILURES DURING WRITE OPERATIONS

(75) Inventors: Sujaya Srinivasan, Folsom, CA (US); David S. Dressler, Loomis, CA (US); John C. Rudelic, Folsom, CA (US); Richard E. Fackenthal, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/077,428

(22) Filed: Feb. 15, 2002

(51) Int. Cl.[7] .................................................. G11C 16/04
(52) U.S. Cl. .............................. 365/185.03; 365/185.18
(58) Field of Search ...................... 365/185.03, 185.04, 365/185.18

(56) References Cited

U.S. PATENT DOCUMENTS 5,774,397 A * 6/1998 Endoh et al. .......... 365/185.03
6,163,479 A * 12/2000 Chevallier ............. 365/185.03

* cited by examiner

Primary Examiner—Huan Hoang
(74) Attorney, Agent, or Firm—Trop, Pruner & Hu, P.C.

(57) ABSTRACT

A multi-level cell memory may include at least two status bits. The status bits may be examined to determine whether or not a write operation was successful after a power loss occurs.

26 Claims, 2 Drawing Sheets

USING MULTIPLE STATUS BITS PER CELL FOR HANDLING POWER FAILURES DURING WRITE OPERATIONS

BACKGROUND

This invention relates to semiconductor memories and particularly to multi-level cell memories.

A multi-level cell memory is comprised of multi-level cells, each of which is able to store multiple charge states or levels. Each of the charge states is associated with a memory element bit pattern.

A flash electrically erasable programmable read only memory (EEPROM) memory cell, as well as other types of memory cells, is configurable to store multiple threshold levels ($V_T$). In the memory cell capable of storing two bits per cell, for example, four threshold levels ($V_T$) are used. The bits are assigned values for each of the threshold levels.

In one embodiment, a multi-level cell may store four charge states. Level three maintains a higher charge than level two, level two maintains a higher charge than level one, and level one maintains a higher charge than level zero. Reference voltages may separate the various charge states. For example, a first reference voltage may separate level three and level two, a second reference voltage may separate level two from level one, and a third reference voltage may separate level one from level zero.

A multi-level cell memory is able to store more than one bit of data based on the number of charge states. For example, a multi-level cell memory that can store four charge states can store two bits of data, a multi-level cell memory that can store eight charge states can store three bits of data, and a multi-level cell memory that can store sixteen charge states can store four bits of data. For each of the N-bit multi-level cell memories, various memory element bit patterns may be associated with each of the different charge states.

The number of charge states storable in a multi-level cell, however, is not limited to powers of two. For example, a multi-level cell memory with three charge states stores 1.5 bits of data. When this multi-level cell is combined with additional decoding logic and coupled to a second similar multi-level cell, three bits of data are provided as the output of the two cell combination. Various other multi-cell combinations are possible as well.

In a single bit per cell memory, a single bit may be utilized as a status bit to determine whether the cell was programmed when a programming or write operation was interrupted by a power failure. With multi-level cell memories, more transitions are possible when programming the cell since there are more cell levels. As a result, a single bit status bit would be non-informing if a power failure occurred.

Thus, there is a need for a system which provides status information when a power failure occurs in connection with a multi-level memory write operation.

DETAILED DESCRIPTION

Figure 1:
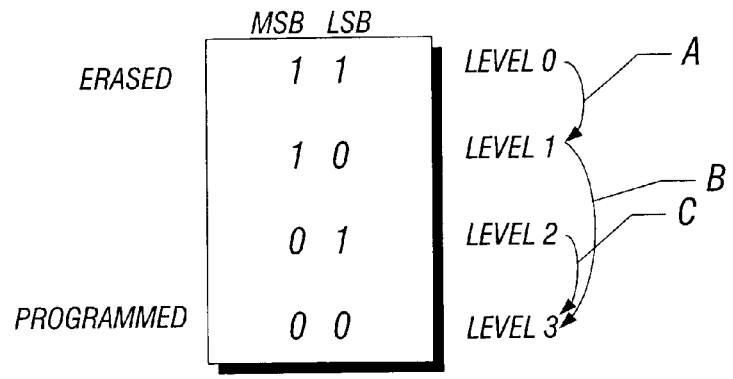
FIG. 1 is a schematic depiction of a multi-level memory cell in accordance with one embodiment of the present invention.

Referring to FIG. 1, an embodiment of a multi-level cell memory may include two status bits, including one status bit that is the more significant bit (MSB) and another status bit which is a less significant bit (LSB). Thus, when transitioning from the erased state, wherein both status bits are one, to the programmed state, wherein both status bits are zero, the memory transitions from the level zero to the level three by way of the level one, wherein the most significant bit is one and the less significant bit is zero, and level two, wherein the most significant bit is zero and the less significant bit is one.

With status bits used in connection with single bit per cell memories, a transition where a bit changes from zero to one is not allowed. In order to be compatible with single bit status indicating systems, transitions from zero to one may be avoided in the multi-bit scenario as well. Thus, the flash cell shown in FIG. 1 may not be programmed so that the status bits transition from "one, zero" to "zero, one" for example. In the case of a power loss that leaves the cell in the wrong state, the correct state could not be determined if zero to one status bit transitions were allowed. This means that a multiple bit power loss recovery system may be provided to compensate for the fact that there is more than one state in a single multi-level memory cell. Thus, the system may avoid the possibility of a power loss during a transition that involves a status bit changing from zero to one, which would leave the cell in an indeterminate state that sometimes reads "one, zero" status bits and sometimes reads a "zero, one" status bits.

In a device of the type depicted in FIG. 1, with two bits per cell, a single memory cell has four possible status bit states: 11, 10, 01 and 00. The states may be defined such that it is always possible to recover to the next state if power is lost during a program or write operation. In order to assure data integrity over a power loss, each cell in a two bit per cell device represents a state. This may result in fewer cells ending up in indeterminate states.

Thus, the cell may transition from level zero to level one; from level one to level three; and similarly from level two to level three. However, no other transitions are allowed in one embodiment. Any other transition would involve transitioning from a zero bit to a one bit in a two bit per cell system.

Figure 2:
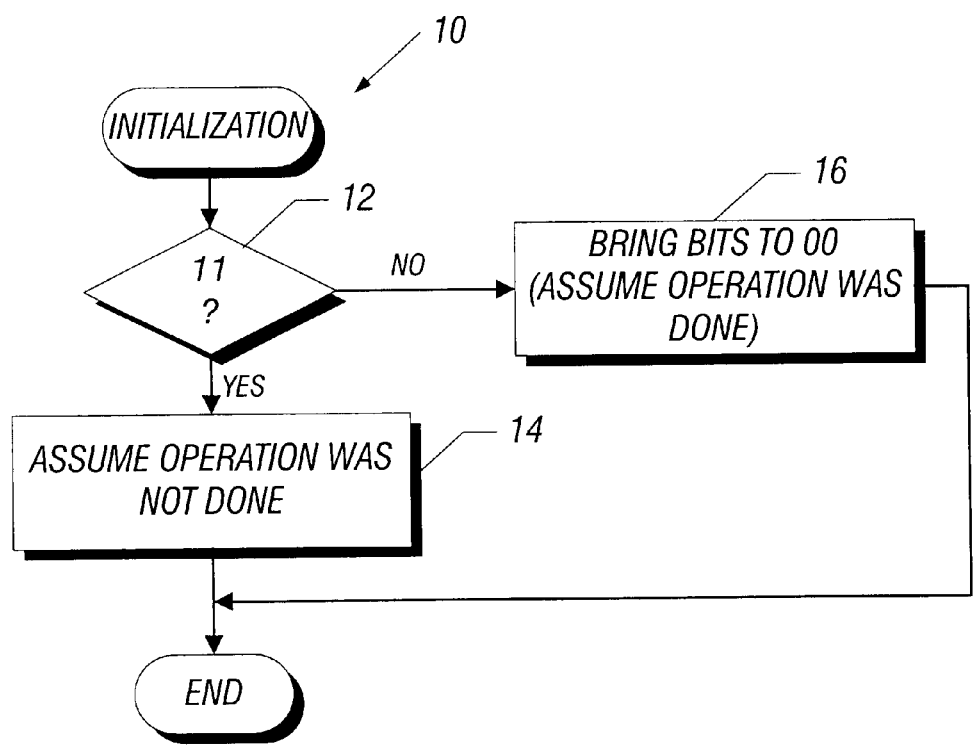
FIG. 2 is a flow chart for software which accompanies one embodiment of the present invention.

Referring to FIG. 2, upon initialization of the memory cell, the software 10 may determine whether or not the memory cell has status bits that have the values one for both the most significant and least significant bits in a two bit per cell example of course other embodiments are possible with more status bits than two bits.

If both status bits are one after a power failure, it is assumed that the program operation was not done. In that case the bits are left with "one" status bits, as indicated in block 14.

Conversely if both bits are not one, as determined in diamond 12, both bits are brought to zero, and it is assumed that the write operation was done. Thus, status bit transitions always occur from one to zero and never from zero to one in one embodiment.

Figure 3:
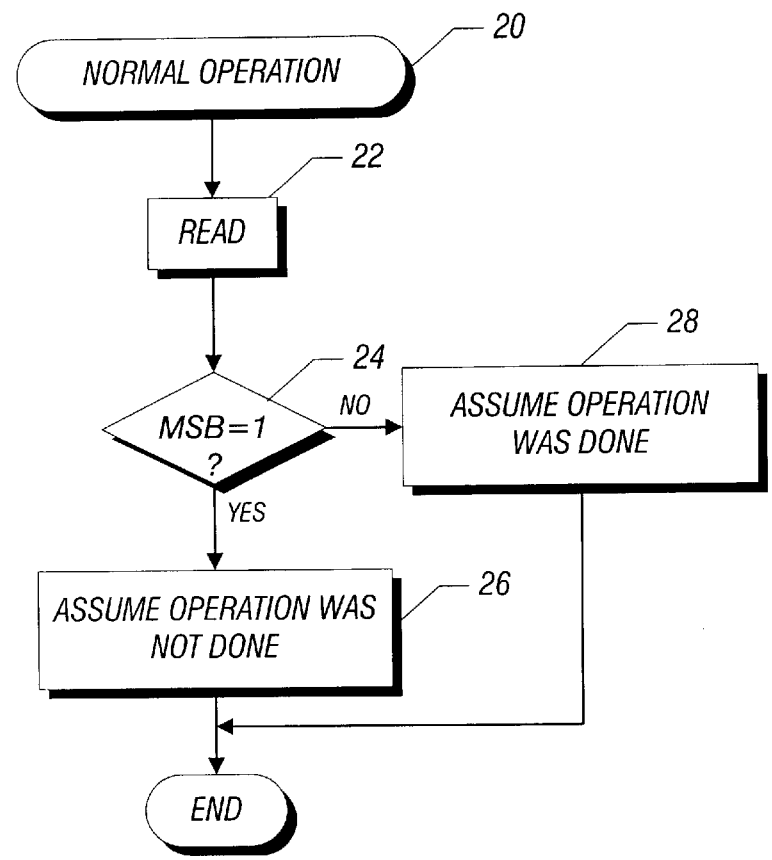
FIG. 3 is a flow chart for software which accompanies another embodiment of the present invention.

Referring to FIG. 3, the software 20 confirms status during normal read operations or, in other words, after initialization of the memory cell. If a read has occurred, a check at diamond 24 determines whether the most significant bit of the status bits is a one. If so, it is assumed that the write operation was not done, as indicated in block 26.

Otherwise it is assumed that the write operation was done as indicated in block 28.

Figure 4:
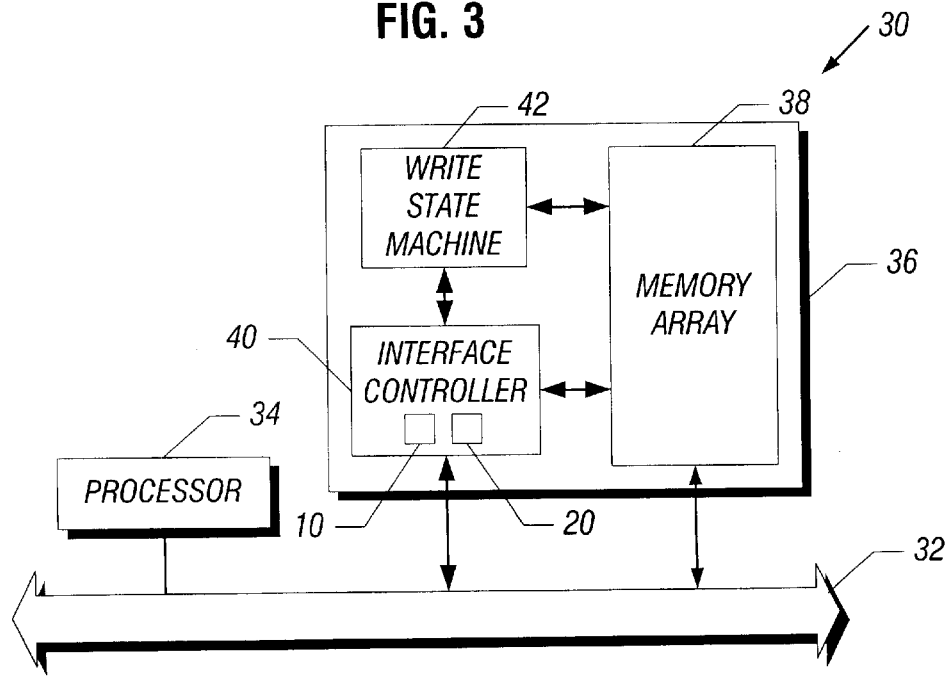
FIG. 4 is a schematic depiction of a multi-level memory in accordance with one embodiment of the present invention.

Finally, referring to FIG. 4, the multi-cell memory 30 may include a processor 34 coupled through a bus 32 to a component 36. The component 36 may include an array 38 of memory cells, an interface controller 40 and a write state machine 42. The write state machine 42 is responsible for writing to the memory array 38. The interface controller 40 may control the read operations of the memory array 38. The interface controller 40, in one embodiment, may store the programs 10 and 20.

An embodiment is illustrated in which software control is utilized. Of course, hardwired embodiments may be utilized as well. In addition, while embodiments of the present invention are described in connection in which only two status bits are utilized, the present invention is applicable to any number of status bits greater than one and multi-level memory cells with any number of levels.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing at least two status bits per cell for a multi-level memory; and
using said status bits to determine the programming state of the cell after a power loss.

2. The method of claim 1 including preventing a status bit transition from zero to one.

3. The method of claim 1 including determining whether, upon initialization, at least two status bits are both one.

4. The method of claim 3 wherein if both status bits are one, designating that the programming operation was not done.

5. The method of claim 3 including bringing both bits to zero if both status bits are not one.

6. The method of claim 1 including, if a read operation has occurred, determining whether the most significant status bit is equal to one.

7. The method of claim 6 wherein if the most significant status bit is one, designating that a write operation was not done.

8. The method of claim 7 wherein if the most significant bit is not equal to one, designating that the write operation was done.

9. An article comprising a medium storing instructions that enable a processor-based system to:
provide at least two status bits per cell for a multi-level memory; and
use said status bits to determine the programming state of the cell after a power loss.

10. The article of claim 9 comprising a medium storing instructions that enable a processor-based system to prevent a status bit transition from zero to one.

11. The article of claim 9 comprising a medium storing instructions that enable a processor-based system to determine whether, upon initialization, at least two status bits are both one.

12. The article of claim 11 comprising a medium storing instructions that enable a processor-based system to designate that the programming operation was not done if both status bits are one.

13. The article of claim 11 comprising a medium storing instructions that enable a processor-based system to bring both bits to zero if both status bits are not one.

14. The article of claim 9 comprising a medium storing instructions that enable a processor-based system to determine during a read operation whether the most significant status bit is equal to one.

15. The article of claim 14 comprising a medium storing instructions that enable a processor-based system to designate that the write operation was not done if the most significant status bit is one.

16. The article of claim 15 comprising a medium storing instructions that enable a processor-based system to designate that the write operation was done if the most significant bit is not equal to one.

17. A multi-level memory comprising:
a cell having at least two status bits; and
an interface to determine the programming state of the cell after a power loss using said status bits.

18. The memory of claim 17 wherein said interface prevents a status bit transition from zero to one.

19. The memory of claim 17 wherein said interface determines, upon initialization, whether at least two status bits are both one.

20. The memory of claim 19 wherein if both status bits are one, said interface designates that a programming operation was not done.

21. The memory of claim 19 wherein said interface sets both bits to zero if both status bits are not one after initialization.

22. The memory of claim 17 wherein said interface during a read operation determines whether the most significant status bit is equal to one.

23. The memory of claim 22 wherein if the most significant status bit is one, the interface designates that the write operation was not done.

24. The memory of claim 23 wherein if the most significant bit is not equal to one, the interface designates that the write operation was done.

25. The memory of claim 17 wherein said interface is a state machine.

26. The memory of claim 17 wherein said memory is a flash memory.

* * * * *